(12) United States Patent
Wolfe et al.

(10) Patent No.: US 6,624,429 B1
(45) Date of Patent: Sep. 23, 2003

(54) LITHOGRAPHIC PATTERNING OF CURVED SUBSTRATES

(75) Inventors: John Charles Wolfe, Houston, TX (US); Paul Ruchhoeft, The Woodlands, TX (US)

(73) Assignee: University of Houston, Houston, TX (US)

( * ) Notice: Subject to any disclaimer, the term of this patent is extended or adjusted under 35 U.S.C. 154(b) by 343 days.

(21) Appl. No.: 09/662,182

(22) Filed: Sep. 14, 2000

(30) Foreign Application Priority Data

May 30, 2000 (AT) .......................................... 944/2000

(51) Int. Cl.[7] .............................................. H01J 37/302
(52) U.S. Cl. .............................. 250/492.22; 252/492.2; 252/398
(58) Field of Search ......................... 250/492.22, 492.2, 250/398

(56) References Cited

U.S. PATENT DOCUMENTS 5,742,062 A    4/1998  Stengl et al.

OTHER PUBLICATIONS

Ruchhoeft et al.; "Pattering Curved Surfaces: Template Generation by Ion Beam Proximity Lithography and Relief Transfer by Step and Flash Imprint Lithography", J. Vac. Sci. Technol. B 17 (6), pp. 2965–2569, Nov./Dec. 1999.
Kaesmaier et al.; "Overview of the Ion Projection Lithography European Medea and International Program", SPIE Conf. on Microlithography, Emerging Lithographic Technologies IV, pp. 1–14, Feb. 28—Mar. 1, 2000.
Hamilton; "Summary of Raytheon Report on Applications and Systems Analysis of Curved IR Imaging Arrays", Darpa MLP Program, pp. 1–9, Mar. 16, 1999.
Koops, "Electron Beam Projection Techniques," Fine Line Lithography, Ed. R Newman, North–Holland, Ch. 3, pp. 235–255, 1980.
Behringer et al.; "Intelligent Design Splitting in the Stencil Mask Technology Used for Electron–and –Ion –Beam Lithography," J. Vac. Sci. Technol. B11(6), p. 2400–2403, Nov./Dec., 1993.
Frosien et al.; "Application of the Electron Microprojector in the Field of Microlithography", Proceedings Microcircuit Engineering '79, Rheinisch–Westfalische Technische Hochshule, Aachen, Germany, pp. 50–58, Sep. 25–27, 1979.

*Primary Examiner*—Bruce Anderson
(74) *Attorney, Agent, or Firm*—Ladas & Parry

(57) ABSTRACT

For producing an exposure pattern on a curved, in particular concave substrate field of a substrate which comprises a layer of resist material sensitive to exposure to an energetic radiation, in a pattern transfer system a wide, substantially parallel beam of said energetic radiation is produced, and by means of said beam a planar mask having a structure pattern, namely, a set of transparent windows to form a structured beam, is illuminated and the structure pattern is imaged onto the substrate by means of the structured beam, producing a pattern image, namely, a spatial distribution of irradiation over the substrate. The direction of incidence of said beam onto the mask is varied through a sequence of inclinations with respect to the normal axis to the mask, the sequence of inclinations being adapted to merge those exposure pattern components which result from neighboring windows of the structure pattern, the exposure with respect to the sequence of inclinations superposing into a spatial distribution of exposure dose on the substrate, said distribution exceeding the specific minimum exposure dose of said resist material within only one or more regions of the substrate field, said region(s) forming the exposure pattern. The center of curvature of the substrate field is positioned to align with the pattern center on the mask. The windows of the structure pattern are arranged in a manner that along each radius from the pattern center, the radial spacing of said windows decreases with increasing radius from the pattern center; preferably, the windows have uniform area.

15 Claims, 5 Drawing Sheets

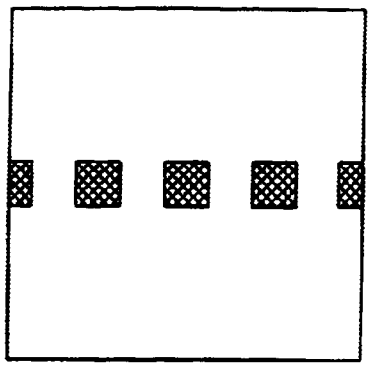
Fig. 10a. SCM design
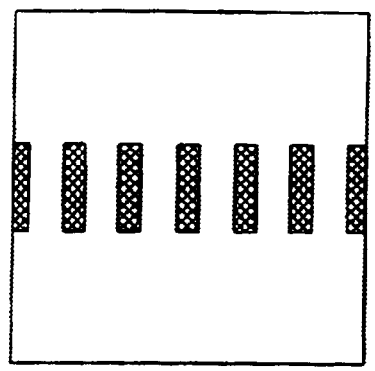
Fig. 10b. SCM windows with local distortion correction
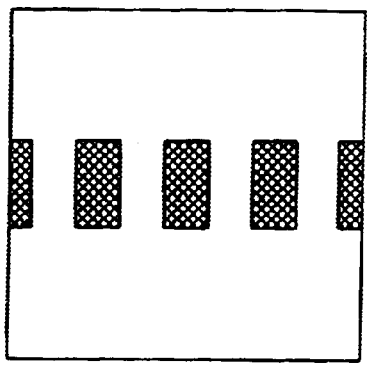
Fig. 10c. projection of the SCM mask (Fig. 10b) on the substrate
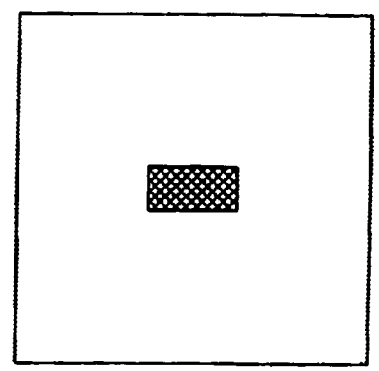
Fig. 10d. scan field projected on the substrate

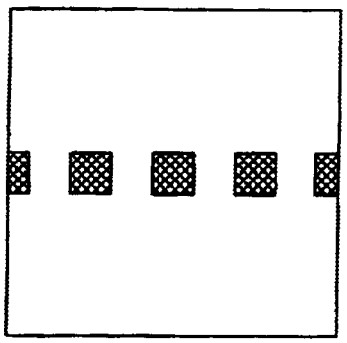
Fig.11a. SCM design
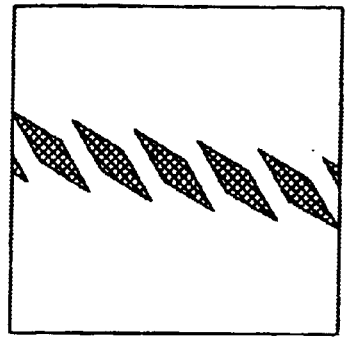
Fig.11b. SCM windows with local distortion correction
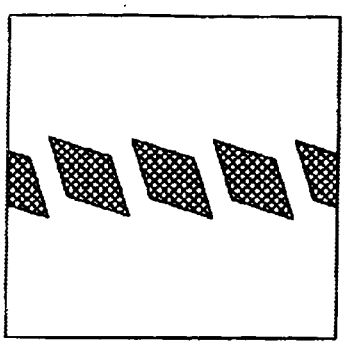
Fig.11c. projection of the SCM mask (Fig.11b) on the substrate
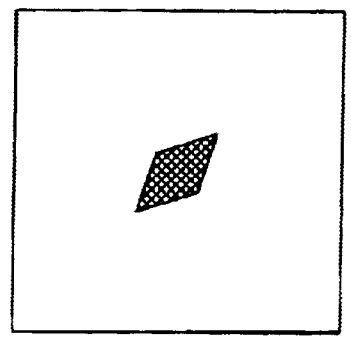
Fig.11d. scan field projected on the substrate
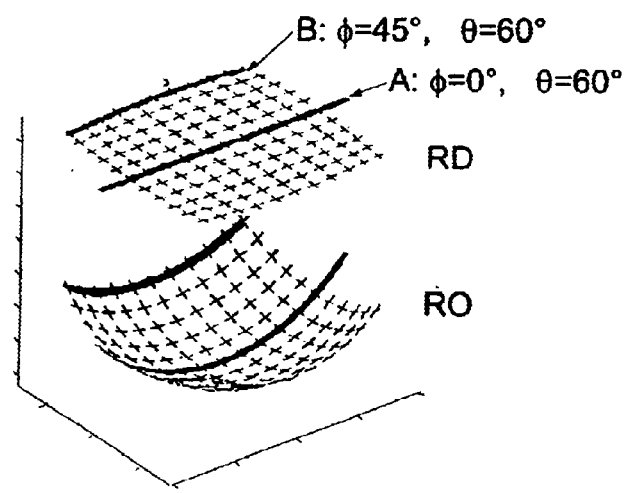
Fig.12

LITHOGRAPHIC PATTERNING OF CURVED SUBSTRATES

FIELD OF THE INVENTION AND DESCRIPTION OF PRIOR ART

The present invention relates to lithographic patterning of a resist layer on a curved substrate, in particular with spherical concave curvature. More specifically, the invention relates to a lithographic method for producing an exposure pattern on a curved substrate field of a substrate, the substrate field comprising material sensitive to exposure to an energetic radiation. In a pattern transfer system a wide, substantially parallel beam of the energetic radiation is produced, and by means of the collimated beam a planar mask having a structure pattern, namely, a set of transparent windows to form a structured beam, is illuminated and the structure pattern is imaged onto the substrate by means of the structured beam, the substrate being positioned after said mask as seen in the optical path of the beam, producing a pattern image, namely, a spatial distribution of irradiation over the substrate.

In manufacturing semiconductor devices, one important step for structuring the semiconductor substrates is lithography. The substrate, for instance a silicon wafer, is coated with a thin layer of photosensitive material, called photoresist. By means of a lithographic imaging system, a pattern is imaged onto the photo-resist, and the subsequent development step removes from the substrate either the exposed or the unexposed portion of the photo-resist. Then, the substrate is subjected to a process step such as etching, deposition, oxidation, doping or the like, the photo-resist pattern on the substrate covering those portions of the surface that shall remain unprocessed. The photo-resist is stripped, leaving the substrate with the new structure. By repeating this sequence, multiple structure layers can be introduced to form the semiconductor micro-circuits.

There has been a growing interest in patterning of curved surfaces at sub-micron dimensions, in particular with optical sensor arrays on concave surfaces, so-called focal surface arrays (FSA). Applications lie in the field of imaging technology, such as infra-red cameras and wide-field optical sensors. To date, the ability to reduce the size, or even miniaturize, infra-red cameras is limited by the size and weight of the optical components; these could be reduced by an order of magnitude if a spherical imaging array is used instead of flat one. Moreover, spherical imaging arrays enable simple, compact optical designs with ultra-wide fields-of-view. In comparison with flat designs, however, the patterning of curved surfaces on the one-micron scale is a challenge because of the large depth of field that is needed for the topographical variation of the substrate.

The inventors, in J. Vac. Sci. Technol B 17(6) pp. 2965–2969, 1999, have shown that shadow printing lithography, in particular ion beam proximity (IBP) lithography, has the resolution and depth-of-field required for the task of patterning FSAs. Lithographic printing methods as well as lithographic devices using electron or ion beams are discussed, for instance, by H. Koops in 'Electron beam projection techniques', Chapter 3 of 'Fine Line Lithography', Ed. R. Newman, North-Holland, 1980, pp. 264–282. Electrons and in particular ions have the advantage of very low particle wavelengths—far below the nanometer range—which allow of very good imaging properties, as e.g. discussed by Rainer Kaesmaier and Hans Löschner in 'Overview of the Ion Projection Lithography European MEDEA and International Program', Proceedings SPIE, Vol. 3997, Emerging Lithography Technologies IV, 2000. Proximity printing using stencil masks is, however, not restricted to particle beam systems, but also possible with lithography systems based on photons, like EUV (Extreme UV) or X-ray lithography.

In shadow printing lithography (and likewise in projection lithography), the pattern to be imaged onto the photoresist-covered substrate is produced by using a mask or reticle having the desired pattern. For particle lithography systems, stencil masks are used in which the patterns to be projected are formed as apertures of appropriate shape in a thin membrane, i.e., a few micrometers thick. The mask pattern is built up from a number of apertures in a thin membrane through which the particle beam is transmitted to expose the resist-coated wafer in those areas required for device fabrication.

Lithographic patterning of curved substrates suffers from a complex of problems arising from the projection of the mask pattern onto substrate areas inclined with respect to the mask, which causes not only a distortion of the mask pattern as compared to the original mask pattern, but also a reduced local exposure dose density. Blur in shadow printing, such as IBP lithography, is due to imperfect collimation of the ions and so depends on the gap between the mask and the substrate surface. Thus, in the particular case of a concave substrate field, the blur, linewidth and exposure latitude all depend upon the radial distance from the center of the substrate field.

It is an aim of the present invention to overcome the above-mentioned problems and, in particular, to show a way to correct for the distortions incurred from the projection of the mask pattern onto the curved substrate field while avoiding other problems as, e.g., deterioration of pattern reproduction due to non-uniformity of dose density.

SUMMARY OF THE INVENTION

The invention provides a solution to the above task by a method as mentioned in the beginning wherein the center of curvature of the substrate field is positioned on a line as defined by a ray of the beam running through a pattern center defined on the mask within the area of the structure pattern, the windows of the structure pattern being arranged in a manner that along each radius from the pattern center, the radial spacing of said windows decreases with increasing radius from the pattern center, and wherein the direction of incidence of said beam onto the mask is varied through a sequence of inclinations with respect to the normal axis to the mask, the sequence of inclinations being adapted to merge those exposure pattern components which result from neighboring windows of the structure pattern, the exposure with respect to the sequence of inclinations superposing into a spatial distribution of exposure dose on the substrate, said distribution exceeding the specific minimum exposure dose of said resist material within only one or more regions of the substrate field, said region(s) forming the exposure pattern.

By virtue of the invention the design of self-supporting masks is possible which allow of a patterning of curved, in particular concave spherical, substrates with a flat mask. The decreasing spacing of the windows with increasing radial distance from the pattern center can suitably be employed to compensate for the effect of distortion due to the curvature of the substrate field.

Devices which are in particular suitable for the above method according to the invention are the lithography apparatus according to claim 14 and the lithography mask according to claim 15. In a preferred embodiment of the invention, the radial spacing of the windows follows the projected distances of uniformly-spaced points on the substrate field projected onto the mask plane. Thus, the imaging distortions upon projection onto the curved substrate are taken into account, simplifying the design of the respective mask pattern. In particular, the structure pattern can be a subset of an array of windows, the position of the windows determined by a two-dimensional array obtained from a regular two-dimensional array of uniformly-spaced points deformed by a transformation corresponding to a projection from the substrate field onto the mask plane. Preferably, the inclination range corresponds to the inclination range used to image an array of windows positioned on said regular two-dimensional array into a full-field exposure pattern on a planar substrate positioned at a distance equal to the radius of curvature of the substrate field.

In a further preferred embodiment, the substrate field has concave curvature and the center of curvature of the substrate field is positioned coinciding with the pattern center. This special geometry greatly enhances the imaging properties of the projection.

Moreover, it is advantageous if the windows of the structure pattern have uniform area. This ensures that every portion of the substrate is sufficiently exposed to radiation even if the substrate is locally inclined with respect to the incident beam.

More relaxed is the condition that the substrate pattern is composed of windows of varying shapes, the dimensions of the windows varying with increasing radius (i.e., distance from the pattern center) according to a contraction factor which is equal to one at the pattern center and decreases with increasing radius, wherein (i) the radial window dimensions decrease according to said contraction factor, and (ii) the window dimensions perpendicular to the respective radial directions increase according to the inverse of said contraction factor.

Here and in the following, the term 'radius' (or 'radial') always refers to the half line (or the direction) from the pattern center to the respective point or window, as the case may be.

In another suitable variant, the substrate pattern is composed of windows of varying shapes, the shape of each window being derived from an original shape uniform to all windows by means of a deformation defined in terms of a contraction factor equal to the quotient of (i) the length of a radial (i.e. oriented parallel to a radius from the pattern center) line element at the position of the respective window and (ii) the length of the projection of said radial line element onto the substrate field, wherein said original shape is shrunk along the radial direction by said contraction factor and stretched along the respective perpendicular direction by the inverse of said contraction factor. Preferably, this original shape is a square.

Advantageously the energetic radiation comprises electrically charged particles and the pattern transfer system is a particle optical imaging system. In particular, the energetic radiation may comprise ions, such as hydrogen or helium ions, and the pattern transfer system is an ion optical imaging system. In this case, it is further suitable if the direction of the beam is inclined by an electrostatic deflection means of the particle optical imaging system.

The invention can be used with a variety of applications, one of which is the patterning of resist layers by energetic radiation. In this case, the substrate field comprises a layer of resist material sensitive to exposure to an energetic radiation. For instance when using ion-beam radiation, there is a host of applications for spatially varying exposure to the ion radiation, such as converting a GaAs substrate into an insulating state by bombardement with, e.g., hydrogen or oxygen ions, doping of semiconductor materials, hardening of material against etching or abrasive attack, or influencing the fraction index by irradiation.

BRIEF DESCRIPTION OF THE DRAWINGS

In the following, the present invention is described in more detail with reference to the drawings, which show in schematic diagrams:

FIG. 10 a layout according to the invention of a line running in radial direction at a polar distance of 60° from the center;

FIG. 11 a layout according to the invention of a line oriented at a 45° angle to the radial direction at a polar distance of 60° from the center;

FIG. 12 the position of the lines of FIGS. 10 and 11 in the context of FIG. 7.

DETAILED DESCRIPTION OF THE INVENTION

As a preferred embodiment of the invention, which is discussed in the following, the production of an exposure pattern is discussed in the context of IBP lithography. It is to be understood that this embodiment is not meant to restrict the invention to this special case. In particular, when ever ions are referred to, the extension to other types of radiation, including e.g. electrons, X-rays or EUV, neutral particles for vapor deposition, or energetic neutral particles is understood and easily reproducible for the person skilled in the art.

Figure 1:
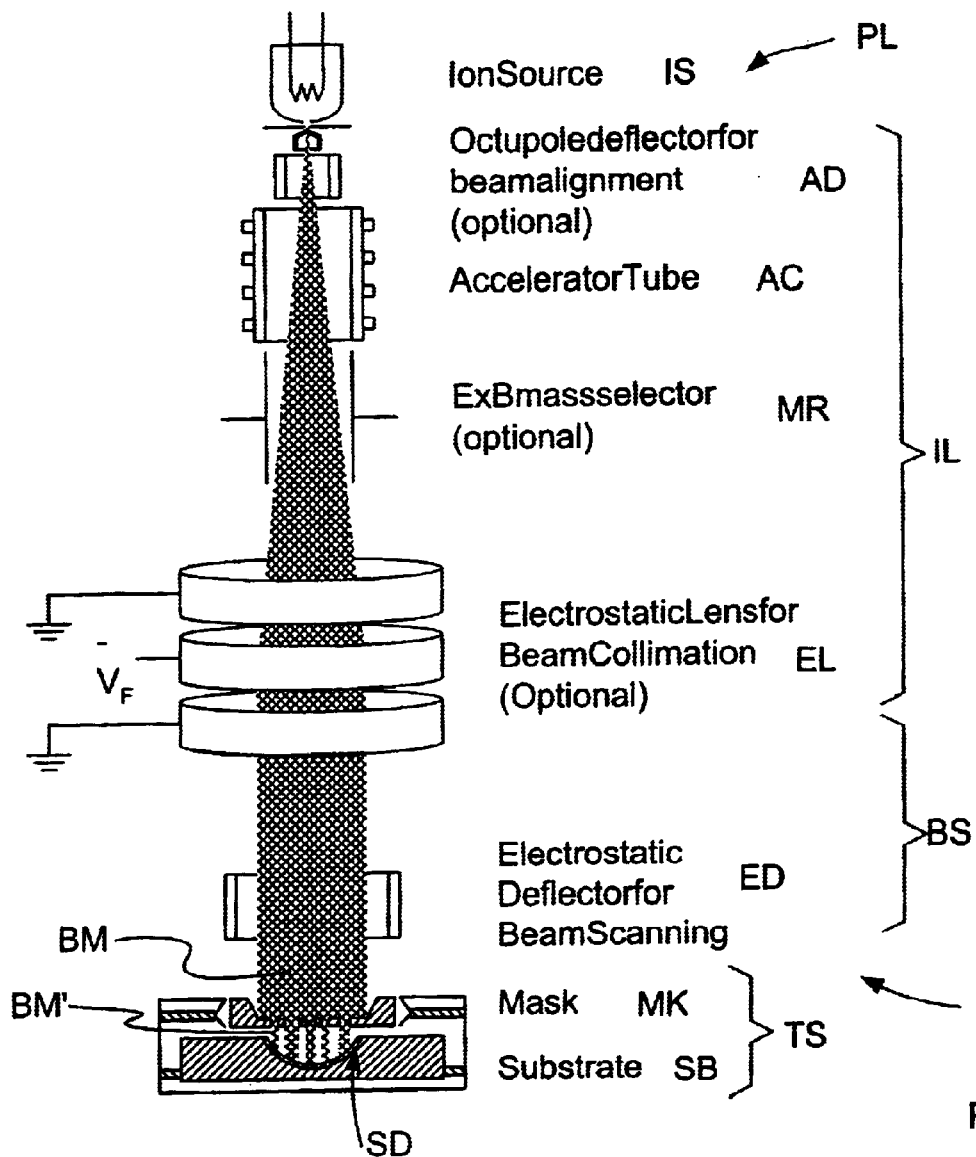
FIG. 1 an ion-beam proximity lithography device according to the invention.

FIG. 1 displays the principles of an IBP lithography apparatus PL. The main components of the lithography system PL are—from top to bottom—an ion source IS producing a helium ion beam, an illumination system IL serving to align, accelerate and collimate the beam, a beam scanning arrangement BS and a target station TS. These components form a pattern transfer system PY which serves to produce a wide beam BM which illuminates a stencil mask MK, wherein the beam covers the whole area of a structure pattern on the mask and by penetrating the mask, the beam is formed into a structured beam BM' which is used to expose a substrate SB held in the target station.

In the embodiment shown, the illumination system IL comprises an octupole deflector AD which provides the beam alignment with respect to the mask and substrate, an accelerator tube AC, a mass selector MR employing, e.g., a Wien filter (E×B) and a sequence of electrostatic lenses EL for the beam collimation. Beam scanning, which is further discussed below, is done by means of an electrostatic deflector device ED. The target station, in this embodiment, is used to position the mask MK and the substrate SB accurately with respect to the beam BM and to each other. The mask MK is placed substantially perpendicular to the beam. The substrate SB is positioned directly after the mask (as seen in the direction of the beam) so as to orient the flat portion of the substrate parallel to the mask, while the curved area of the substrate which is to be exposed to the beam pattern produced by the mask—i.e., the substrate field SD—is positioned to the appropriate lateral position facing the mask.

Figure 2:
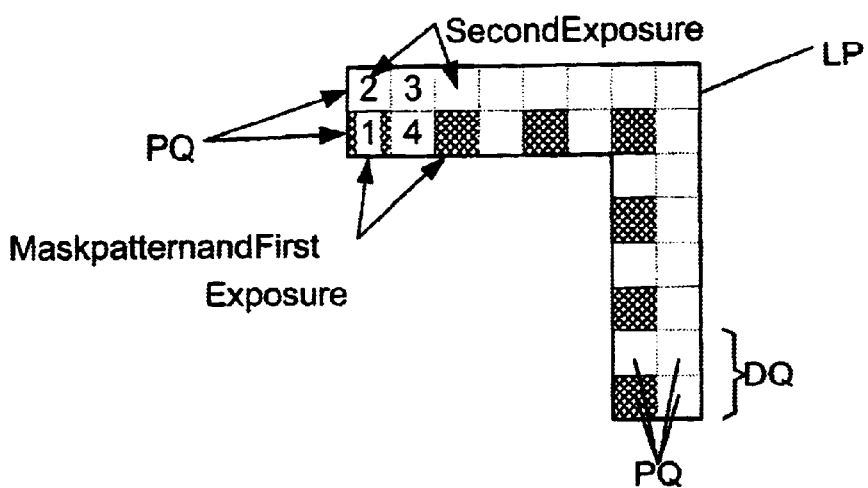
FIG. 2 an example of a self-complementary structure pattern.

Any lithographic technique that employs stencil masks must deal with the engineering challenge of providing rigid support for the opaque mask elements. With self-supporting stencil masks a problem arises for configurations which require a ring-shaped exposure region on the wafer: the central area of the ring-shaped region is completely surrounded by the aperture (so-called dough-nut problem) and thus 'cut out'. Problems also arise with simply connected patterns like free-standing bars or leafs. H. Koops, op. cit., pp. 245–248, proposes the so-called "multibeam" solution, which subdivides the device pattern into squares of equal area by a software routine; for each square of the device pattern, an aperture is provided in the aperture pattern which, though, only covers a fraction, e.g. a quarter, of the device pattern square. This is illustrated in FIG. 2 with an L-shaped device pattern LP. The structure of the pattern is subdivided into quadratic areas PQ which each correspond to a quarter of the smallest elements in the device pattern desired. The substrate is multiply exposed with this aperture pattern, in the example of FIG. 2 four times where each square PQ is shifted laterally to the four quadrants of a square DQ of doubled side length, and the total pattern is constructed by subsequent exposures of the wafer; for each shift position, the same duration of irradiation is used. By virtue of the "multibeam" solution, a plurality of small apertures is realized instead of a large opening in the foil, and the remaining foil forms stable struts between the apertures which improves the mechanical stability of the mask and eases preparation of the masks.

The "multibeam" solution has been rejected for the use in semiconductor lines since it appeared that only straight lines parallel to one of the directions of the lateral shift and, moreover, only structures having dimensions which are integer multiples of the distance between neighboring aperture openings could be obtained. Moreover, it was held that it is impossible to compose from 'orthonormal' squares as defined by the lateral shift displacements a sufficiently smooth edge running along an inclined line—a problem very similar to the problem well known from digitalization of images into raster graphics. To overcome this "digitalization" problem of the "multi-beam" solution, Chalupka et al., in the U.S. Ser. No. 09/363,019, propose a generalization of the concept of H. Koops, namely, a self-complementary mask with a structure pattern in which the dimension and/or direction of at least one structure of the structure pattern is incongruent with respect to the lateral shifts, and use a finite pattern transfer blur of the pattern transfer system. By virtue of the fact that the resist material needs a specific minimum exposure dose, the superposing distributions stemming from neighboring pattern structures result in structures which are, within prescribed limits of geometrical accuracy, slanted with respect to the direction of the lateral movement and structures of arbitrary dimensions.

An alternative approach, presented e.g. by U. Behringer and H. Engelke in 'Intelligent Design Splitting in the Stencil Mask Technology Used for Electron- and Ion-Beam Lithography', J. Vac. Sci. Technol. B11(6), pp. 2400–2403, November/December 1993, splits the device pattern into complementary mask fields situated on at least two masks. Thus, the pattern on each complementary mask is more stable; however, now a set of masks has to be handled within the lithography setup. Also the production expenses of the stencil masks are multiplied accordingly. Moreover, the control of the exposure dose on the curved substrate complicates the splitting into complementary mask patterns.

Figure 3A:
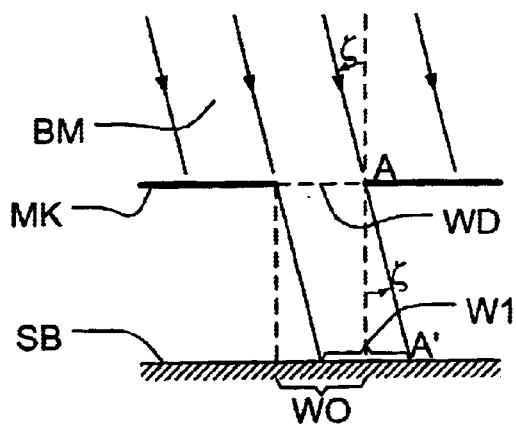
FIG. 3 the projection of one window of the self-complementary pattern with an inclined beam onto the substrate.
Figure 3B:
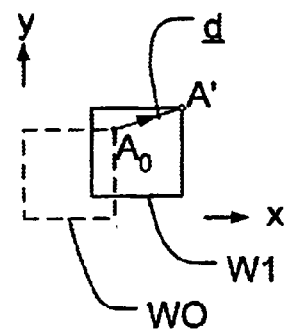
Figure 4A:
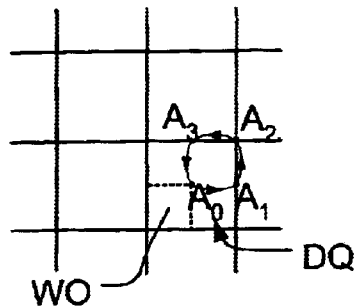
FIG. 4 various possible sequences of beam inclinations according to the invention.
Figure 4B:
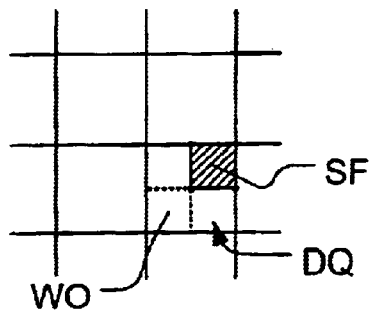
Figure 4C:
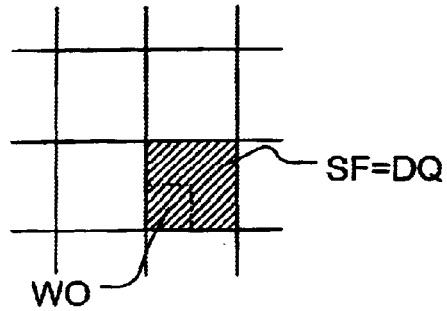
Figure 4D:
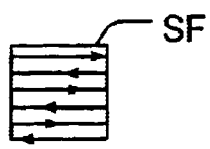
Figure 4E:
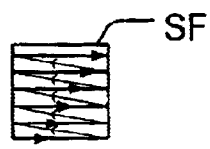
Figure 4F:
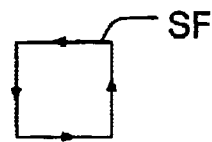

For these reasons, the "multibeam" concept is adopted as a starting point for the present invention using self-complementary masks (SCM). For stitching together the SCM exposures, a more general method is used with the preferred embodiment, including continuously scanning the beam by means of electrostatic deflection plates. FIG. 3a shows the ion beam BM penetrating the mask MK through one of the pattern windows WD which is imaged onto the substrate SB. For the sake of simplicity, in FIG. 3a only one window WD is shown, which is assumed to be near to the center of the mask field, so the curvature of the substrate SB can, for the moment, be neglected. At a time, the beam images the window WD as an image W1 on the substrate SB. During the exposure, the beam is deflected through a sequence of inclinations $\zeta$. As illustrated in FIG. 3a, the inclination $\zeta$ can be defined as the direction of incidence of a ray of the beam BM, running through a given point A of the window (or the mask), taken with respect to the normal direction to the mask on the point A. It should be noted that the inclination has two components as the beam can be inclined to both X- and Y-directions as shown in FIG. 3b. As further illustrated in FIG. 3b, the inclination $\zeta$ can equally well be described by the offset vector d (under-lined symbols denote vectors in this specification) which describes the position of the image A' of the point A on the substrate with respect to its "zero position" $A_0$. This "zero position" $A_0$ is the position of the image for "zero inclination", that is, perpendicular incidence of the beam ('perpendicular' taken with respect to the mask plane); the images W0 and W1 of the window WD correspond to the points $A_0$ and A', respectively. In the example, the zero inclination is used as the initial inclination from which the exposure of the substrate starts.

FIG. 4 shows some of the possible sets of inclinations that can be used. The desired exposure pattern can, e.g., be formed by the method implementing the procedure of H. Koops, i.e., four exposures of a mask imaging each square opening at four discrete inclinations represented by the points $A_0, \ldots, A_3$. In general, the image of the window (in FIG. 4a–f, only the "zero image" W0 is shown) is moved over the target element DQ of the substrate field by varying the inclination of the beam through a sequence of inclinations. In FIG. 4b the area SF denotes the scan field covered by the image point A' in the course of its scanning movement during the exposure. In the variant shown in FIG. 4b, the scan field SF covers an area complementary to the area of the window image W0 with respect to the design element DQ; preferably, however, the scan field covers an area as large as a design element DQ, as shown in FIG. 4c. Examples of possible scan paths within the scan field, beside that of FIG. 4a, are given in FIGS. 4d–f. In FIGS. 4d and 4e, the number of scan lines is chosen such that the distance between the scan lines does not exceed the blur of the imaging system. Thus, the sequence of inclinations causes the individual images of neighboring windows of the structure pattern to merge.

In the present embodiment, the design pattern is basically split into pattern elements DQ of square shape, and the SCM windows WD form one quarter of each pattern element present (FIGS. 2 and 4). This "Manhattan" geometry, as it is sometimes called, is the preferred way of splitting of a design pattern into a set of SCM structures, although it is clear that other shapes of the pattern elements or other methods of splitting are equally well possible.

Another issue for curved substrates is the influence of the varying mask-to-wafer gap upon the linewidth, i.e., the lateral size with which a mask pattern structure of given width is reproduced in the exposed resist. Extensive simulations made by the inventors showed that with a dose of exposure suitably chosen, for example 3.9 $\mu C/cm^2$ of $He^+$ ions having an energy of 75 keV in the case of exposure of a 200 nm thick PMMA resist layer, the variation of the linewidth due to varying gap is very low so as to be neglectable in the context of the invention.

It should further be noted that since mask heating limits the available current density, at most a two-fold throughput reduction must be accepted with the above IBP scanning strategy as compared to exposing a pair of complementary masks. However, the advantages of a twofold reduction in the number of masks, in the number of mask alignments and in pattern density are very significant; not only are mask and alignment costs reduced, but mask distortion can be smaller as well. Since the distortion is caused by the relaxation of the mask when the windows are etched, it is clear that a lower pattern density will result in reduced distortion.

The discussion so far neglected the concave, in particular spherical, curvature of FSA substrates. The considerations with FIGS. 2–4 were formulated above in the context of planar substrates and apply with sufficient accuracy to curved substrates only in the region sufficiently near to the central axis where the substrate is locally parallel to the mask plane.

Figure 5:
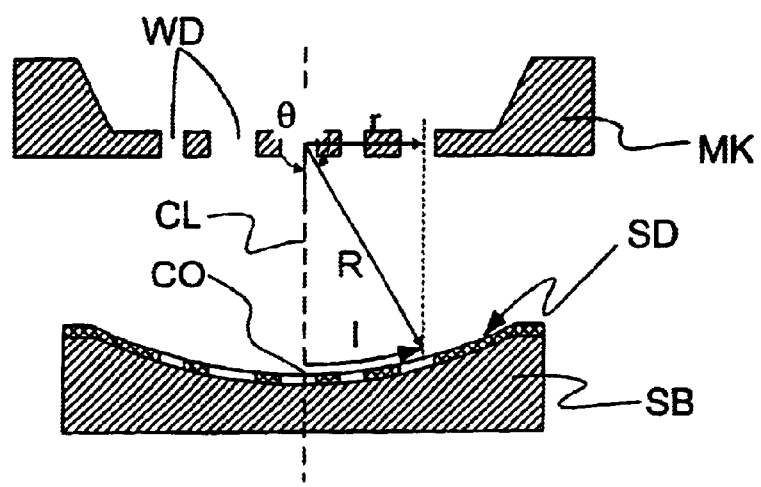
FIG. 5 the geometry of projecting a flat mask onto a spherical substrate, in a longitudinal-sectional view.

FIG. 5 shows a curved substrate above which the planar mask is positioned. Preferably, the substrate field—which in the present embodiment is an FSA substrate—is concave, in particular spherical concave, and is positioned to coincide with a point of the mask which, in the following, is referred to as the center of the mask pattern field or, in short, the pattern center. By virtue of this choice, as will be discussed below in detail, the radial scan field is independent of position on the substrate. As further shown in FIG. 5, a measure of the scanning width is given by the inclination span $\zeta=CD/R$, where CD is the critical dimension of the circuit (typically twice the size of the SCM windows), and R is the mask-substrate-distance taken with respect to the center of the mask and the substrate, which for this special geometry is equal to the radius of curvature. In general, however, the substrate field SD can be concave or convex, with the center of the substrate field being aligned with the pattern center such that the latter is projected by the beam onto the substrate field center.

Figure 6:
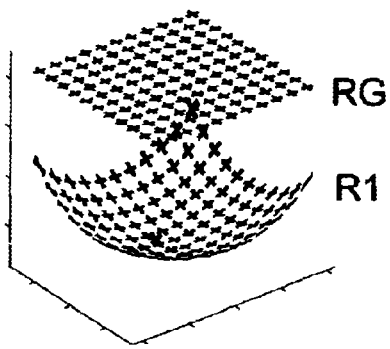
FIG. 6 the distortion of a flat rectangular grid projected in the geometry of FIG. 5.

As can be seen from FIG. 5, the printing of a planar mask MK onto a spherical substrate field SD causes a non-linear global deformation:

$$r \rightarrow l = R \cdot \theta = R \text{arc sin}(r/R)$$
$$\phi \rightarrow \phi \qquad (1)$$

where r is the radial position of a window WD in the mask, taken with respect to the pattern center, $\phi$ is the azimuthal angle ($\phi$ is not shown in FIG. 6 as it represents the angle around the axis CL). Here R is the radius of curvature of the substrate. According to the above, R is also the distance of the substrate from the mask taken along the center line CL which passes through the pattern center in the mask and the center C0 of the substrate field. Further, $\theta$ is the polar angle of the corresponding element on the substrate and l is the arc length which corresponds to r, both taken from the center C0. FIG. 6 shows the distortion that the deformation according to equation 1 causes for a rectangular grid RG on the mask, resulting in a pin-cushion-distorted image R1. The inclination of the beam can be neglected in equation 1 and FIGS. 5 and 6 since in the context of the invention, the dimensions of the mask pattern windows WD are small (e.g. 0.5 $\mu$m) with respect to the central distance R.

The distortion of a rectangular grid as shown in FIG. 6 can be corrected by applying a transformation inverse to the transformation of equation 1 to the mask pattern, namely:

$$r_0 \rightarrow r = R \sin(r_0/R) \qquad (2)$$

Figure 7:
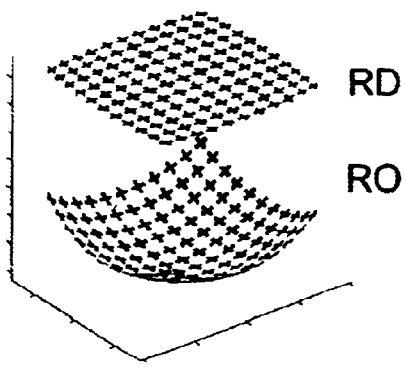
FIG. 7 a corrected grid pattern to compensate the distortion shown in FIG. 6.

Here $r_0$ is the radial position of a point in the design (CAD) file which is corrected by equation 2 in order to obtain the corrected position r on the mask. The azimuthal position $\phi$ is not changed. As can be seen from FIG. 7, the correction represents a barrel distortion of the structure pattern RD with respect to the design image, which is now reproduced in the image R0 on the substrate.

Figure 8:
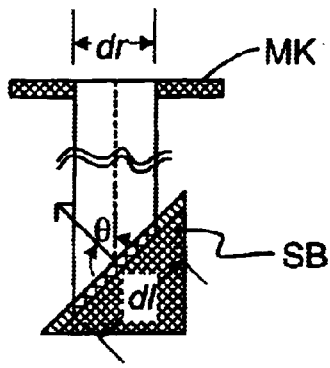
FIG. 8 the local distortion of a structure pattern window.

Due to the small size of the pattern windows, the substrate surface is essentially flat on the scale of the image of a single window and the differential form $$dr \rightarrow dl = dr/\cos \theta$$
$$d\phi \rightarrow d\phi \qquad (3)$$

describes the distortion of a window. The inclination of the substrate relative to the ion beam is responsible for the radial expansion implied by equation 3. This is illustrated in FIG. 8. As a further effect, the radial expansion of the substrate area leads to a reduction of the exposure dose density as compared to the region near to the substrate center C0.

According to the invention, the following correction algorithm for the window pattern of an SCM is proposed which compensates for the distortion as described by equations 1 and 3. The correction is composed of a global part which corrects the position of the structure pattern windows WD, and a local part which is specific to each window and defines a distortion of shape of the window. The global correction, applied to the center point of each window, is performed according to equation 1. Then, to each window a local correction is applied, which is stated in terms of a local coordinate system (dr, dq) aligned along the radial direction from the pattern center; thus, the local q-direction runs in the tangential direction. The local correction is defined in terms of the actual distance r of the window from the pattern center:

$$dr_0 \rightarrow dr = dr_0 \cdot \cos(r/R)$$
$$dq_0 \rightarrow dq = dq_0/\cos(r/R) \qquad (4)$$

This local transformation 4 corresponds to the inverse of equation 3 only with respect to the radial components. For the tangential component, the transformation avoid problems with the stitching of the SCM windows and dose control, which would occur if the inverse of equation 3 were applied, which would simply read $dq=dq_0$.

As can be seen directly from 4, the tangential dimensions of the window are expanded so as to keep constant its area.

This compensates for the reduction in exposure dose density caused by the radial expansion mentioned above, and ensures that the amount of exposure dose is uniform for all exposure pattern components that result from the structure pattern windows.

Figure 9:
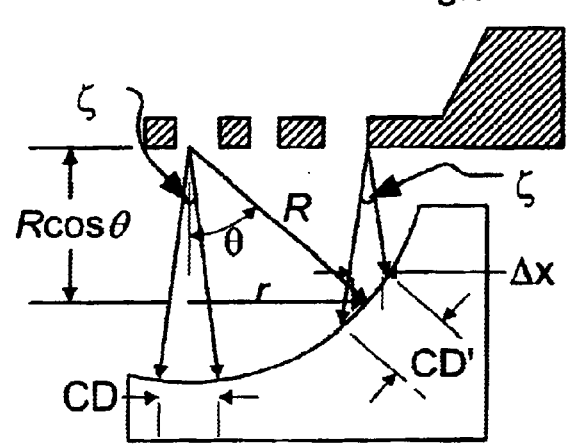
FIG. 9 the effect of stitching of the pattern windows.

The electrostatic stitching process for a corrected SCM is illustrated in FIG. 9. As already re-marked earlier, the inclination span is given by $\zeta$=CD/R, where CD is the critical dimension of the features to be patterned on the substrate. The beam inclination is the same at all radii r because the beam is collimated to be uniform over the whole mask pattern field. The scanned distance at r is proportional to the local mask-to-substrate gap, i.e., $\Delta x = \zeta \cdot R \cdot \cos\theta = CD \cdot \cos\theta$ and the projected distance $CD' = \Delta x/\cos\theta = CD$. Thus, the radial dimension of the scan field is independent of position on the substrate. The tangential dimension of the scan field, however, shrinks by $\cos\theta$ (i.e., proportional to the gap); therefore, the corrected windows would not touch in the tangential direction if they were not expanded by the local transformation 4. The dose is also uniform in the stitched image because the areas of the corrected SCM windows are independent of their respective position.

Thus, there is a compensation of the effect of reduced irradiation density from the incident beam upon the inclined substrate surface by the reduction in scanning distance $\Delta x$ which is a direct consequence of the reduced mask-substrate-gap. It is noteworthy, and it also constitutes a major aspect of the invention, that this compensation can be obtained for curved substrate fields of sizes not negligible to the radius of curvature only if the substrate field has concave spherical curvature and the center of curvature coincides with the mask.

In the special case that the circuit design is restricted to geometries only having contours along the X- and Y-direction with a uniform minimum feature size of $2\lambda$, the structure pattern can be divided into square SCM openings, $\lambda \times \lambda$ in size, so that the original pattern is reconstructed by four offset exposures (see FIG. 2), and the positions and shapes of the individual openings can be calculated using a database as follows.

The database of SCM elements contains i) the center coordinate $\underline{r}_C=(x_C, y_C)$ of each SCM window and ii) a set of the coordinates $\Delta \underline{r}_j$ of the corners (numbered, e.g., with j=0, . . . , 3) relative to the center. This is based on the fact the every point $\underline{r}$ in the SCM window can be written as the sum $\underline{r}=\underline{r}_C+\Delta \underline{r}$, where $\Delta \underline{r}$ is the vector describing the point relative to the center. These coordinates are transformed according to $$\underline{r}=\underline{r}_C+\Delta\underline{r} \rightarrow \underline{r}'=M_{global}\underline{r}_C+M_{local}\Delta\underline{r} \qquad (5)$$

employing global and local distortion correction matrices, $M_{global}$ and $M_{local}$, respectively.

From eq.(3), the global distortion correction matrix is $$M_{global} = \begin{bmatrix} \frac{R}{r}\sin\left(\frac{r}{R}\right) & 0 \\ 0 & \frac{R}{r}\sin\left(\frac{r}{R}\right) \end{bmatrix}, \qquad (6)$$

where $r=|\underline{r}_C|=\sqrt{(x_C^2+y_C^2)}$ and R is the radius of curvature. The local distortion correction matrix is derived from a sequence of three transformations: (1) a rotation of the element by the angle $\phi$, where $\phi=\arctan(y_C/x_C)$, (2) a shrinking of the 'horizontal' direction (i.e. the intermediate x-direction) by a factor $\cos\theta$ and a stretching of the 'vertical' direction (i.e. the intermediate y-direction) by the inverse factor $1/\cos\theta$, and (3) a rotation by $-\phi$, that is, back to its original orientation:

$$M_{local} = \begin{bmatrix} \frac{\sin^2(\phi)}{\cos(\theta)} + \cos(\theta)\cos^2(\phi) & \frac{-\cos(\phi)\sin(\phi)}{\cos(\theta)} + \cos(\theta)\cos(\phi)\sin(\phi) \\ \frac{-\cos(\phi)\sin(\phi)}{\cos(\theta)} + \cos(\theta)\cos(\phi)\sin(\phi) & \frac{\cos^2(\phi)}{\cos(\theta)} + \cos(\theta)\sin^2(\phi) \end{bmatrix} \qquad (7)$$

The local coordinates are stored relative to the center coordinate. The global distortion correction must be completed before the local pre-distortion matrix is applied, since the new center coordinates from the global distortion correction are used in local distortion correction transformation.

FIG. 10 illustrates the design of an SCM pattern according to the invention for a line that runs along a radius of the mask at a polar angle of 60° (point A of FIG. 12). In a similar manner, FIG. 11 shows the layout of a line on an SCM that is parallel to that in FIG. 10 but at a point that lies on a line oriented at 45° to the scanning axes; the polar angle is again 60° (point B of FIG. 12). FIGS. 10 and 11 respectively show: (a) the CAD design of the SCM windows prior to the correction formalism explained above, (b) the locally corrected SCM windows, (c) the projected image on the substrate, and (d) the scan field on the substrate.

FIG. 12 shows the two lines corresponding to FIGS. 10 and 11 on the spherical substrate; crosses are drawn to better see the spherical shape. For each line, the most challenging location, in terms of lithography, is at $\theta=60°$. These points have been marked as locations A and B on the figure.

FIGS. 10(a) and 11(a) show the CAD design of SCM windows on which the determination of a corrected structure pattern is based. Since the line shall have a linewidth of $2\lambda=1$ μm, the side length of the squares is $\lambda=0.5$ μm.

FIGS. 10(b) and 11(b) show the SCM windows after the correction transformation 5. As can be seen, the windows as well as the spacing of neighboring windows are compressed in the radial direction and elongated in the perpendicular (tangential) direction.

FIGS. 10(c) and 11(c) display the images of the SCM windows of FIGS. 10(b) and 11(b), respectively, as projected on the substrate. The distance of the window along the line corresponds to that of the initial CAD design; moreover, the lateral widening of the lines is clearly visible, which serves to compensate for the reduction of exposure dose density due to the local inclination of the substrate with respect to the beam.

FIGS. 10(d) and 11(d), for comparison, give a representation of the scan field SF (compare FIG. 4b) which is imaged on the substrate at the respective local points of FIGS. 10 and 11. As can be seen, the scan field—which originally is a square of dimensions $2\lambda \times 2\lambda = 1 \times 1$ μm—is elongated in the respective radial direction.

Simulation calculations performed by the inventors for the cases of FIGS. 10 and 11 showed that the line of FIG. 10 will be reproduced as a 1 μm wide line without any linewidth fluctuations. Also for the line of FIG. 11 a good reproduction of the resulting printed line was found, wherein the linewidth varied by ±8% only, which is well within the usual tolerances. Thus, also this line oriented at 45° to the scan direction print quite satisfactorily, as well, and it can be concluded that FSA patterning is possible with acceptable linewidth control for structuring of features as small as 1 μm.

As an extension towards the method of Chalupka et al, the "Manhattan" geometry may be relaxed, and pattern structures are employed which are incongruent with exactly evenly-spaced windows. However, the distances of the windows are still based on an overall basic spacing which represents the initial "Manhattan" grid to which the correction transformation according to the invention (equations 5 to 7) is applied. This spacing, which in principle corresponds to the cross grid RD of FIG. 7, then defines locally the principal distances of the windows on the planar mask. It should be noted, however, that the deviations of the actual structure pattern from the grid are small, usually in the range of a few percent, and depend on the local pattern design, whereas the distortion due to the correction transformation according to the invention is defined over the whole mask pattern field, an can grow considerable large with the polar angle approaching 90°.

We claim:

1. A lithographic method for producing an exposure pattern on a curved substrate field of a substrate, the substrate field comprising material sensitive to exposure to an energetic radiation, the method comprising producing a wide, substantially parallel beam of said energetic radiation, illuminating a planar mask having a structure pattern of a set of transparent windows with said substantially parallel beam to form a structured beam, and imaging the structure pattern onto the substrate by means of the structured beam for producing a pattern image of a spatial distribution of irradiation over the substrate, wherein the center of curvature of the substrate field is positioned on a line as defined by a ray of the bream running through a pattern center defined on the mask within the area of the structure pattern, the windows of the structure pattern being arranged in a manner that along each radius from the pattern center, the radial spacing of said windows decreases with increasing radius from the pattern center, and wherein the direction of incidence of said beam onto the mask is varied through a sequence of inclinations with respect to the normal axis to the mask, the sequence of inclinations being adapted to merge those exposure pattern components which result from neighboring windows of the structure pattern, the exposure with respect to the sequence of inclinations superposing into a spatial distribution of exposure dose on the substrate, said distribution exceeding the specific minimum exposure dose of said resist material within only one or more regions of the substrate field, said region(s) forming the exposure pattern.

2. The method of claim 1, wherein the radial spacing of the windows follows the projected distances of uniformly-spaced points on the substrate field projected onto the mask plane.

3. The method of claim 2, wherein the structure pattern is a subset of an array of windows, the position of the windows determined by a two-dimensional array obtained from a regular two-dimensional array of uniformly-spaced points deformed by a transformation corresponding to a projection from the substrate field onto the mask plane.

4. The method of claim 3, wherein the inclination range corresponds to the inclination range used to image an array of windows positioned on said regular two-dimensional array into a full-field exposure pattern on a planar substrate positioned at a distance equal to the radius of curvature of the substrate field.

5. The method of claim 1, wherein the substrate field has concave curvature and the center of curvature of the substrate field is positioned coinciding with the pattern center.

6. The method of claim 1, wherein the windows of the structure pattern have uniform area.

7. The method of claim 1, wherein the substrate pattern is composed of windows of varying shapes, the dimensions of the windows varying with increasing radius (i.e., distance from the pattern center) according to a contraction factor which is equal to one at the pattern center and decreases with increasing radius, wherein (i) the radial window dimensions decrease according to said contraction factor, and (ii) the window dimensions perpendicular to the respective radial directions increase according to the inverse of said contraction factor.

8. The method of claim 1, wherein the substrate pattern is composed of windows of varying shapes, the shape of each window being derived from an original shape uniform to all windows by means of a deformation defined in terms of a contraction factor equal to the quotient of (i) the length of a radial (i.e. oriented parallel to a radius from the pattern center) line element at the position of the respective window and (ii) the length of the projection of said radial line element onto the substrate field, wherein said original shape is shrunk along the radial (i.e. parallel to a radius from the pattern center) direction by said contraction factor and stretched along the respective perpendicular direction by the inverse of said contraction factor.

9. The method of claim 8, wherein said original shape is a square.

10. The method of claim 1, wherein the energetic radiation comprises electrically charged particles and the pattern transfer system is a particle optical imaging system.

11. The method of claim 10, wherein the energetic radiation comprises ions, such as hydrogen or helium ions, and the pattern transfer system is an ion optical imaging system.

12. The method of claim 10, wherein the direction of the beam is inclined by an electrostatic deflection means of the particle optical imaging system.

13. The method of claim 1, wherein the substrate field comprises a layer of resist material sensitive to exposure to an energetic radiation.

14. A lithographic apparatus for producing an exposure pattern on a curved substrate field of a substrate having a pattern transfer system to produce a wide, substantially parallel beam of energetic radiation and a target station adapted to position a planar mask into the beam and the substrate after said mask as seen in the optical path of the beam, the target station being adapted to position the center of curvature of the substrate field on a line as defined by a ray of the beam running through a pattern center defined on the mask within the area of the structure pattern, the planar mask having a structure pattern, namely, a set of transparent windows being arranged in a manner that along each radius from the pattern center, the radial spacing of said windows decreases with increasing radius from the pattern center, and the substrate field comprising material sensitive to exposure to said energetic radiation, the pattern transfer system being adapted to illuminate the beam on the mask, imaging the structure pattern onto the substrate by means of the beam thus structured, producing a pattern image, namely, a spatial distribution of irradiation over the substrate, and to vary the direction of incidence of said beam onto the mask through a sequence of inclinations with respect to the normal axis to the mask, the sequence of inclinations being adapted to merge those exposure pattern components which result from neighboring windows of the structure pattern, the exposure with respect to the sequence of inclinations superposing into a spatial distribution of exposure dose on the substrate, said distribution exceeding the specific minimum exposure dose of said resist material within only one or more regions of the substrate field, said region(s) forming the exposure pattern.

15. A planar lithography mask for use in a method according to claim 1 or an apparatus according to claim 14, the mask having a structure pattern, namely, a set of transparent windows to form a beam of energetic radiation illuminated on the mask into a structured beam, the windows of the structure pattern being arranged in a manner that along a radius from a pattern center defined on the mask within the area of the structure pattern, the radial spacing of said windows decreases with increasing radius from the pattern center.

* * * * *